US006472944B2

(12) United States Patent
Soda

(10) Patent No.: US 6,472,944 B2
(45) Date of Patent: Oct. 29, 2002

(54) VOLTAGE CONTROLLED OSCILLATOR WITH DELAY CIRCUITS

(75) Inventor: Masaaki Soda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/769,539

(22) Filed: Jan. 25, 2001

(65) Prior Publication Data

US 2001/0009392 A1 Jul. 26, 2001

(30) Foreign Application Priority Data

Jan. 26, 2000 (JP) ........................................ 2000-017190

(51) Int. Cl.[7] ................................................ H03B 5/02
(52) U.S. Cl. ...................... 331/57; 331/177 R; 331/175; 327/266; 327/274
(58) Field of Search ................................ 331/57, 177 R, 331/175; 327/261, 266, 270, 272, 274

(56) References Cited

U.S. PATENT DOCUMENTS

| 5,300,898 A | 4/1994 | Chen et al. .................... 331/57 |
| 5,600,280 A | 2/1997 | Zhang .......................... 331/57 |
| 6,014,062 A | 1/2000 | Bryan et al. .................. 331/57 |

FOREIGN PATENT DOCUMENTS

| EP | 0 306 662 A2 | 7/1988 | ............. H03K/5/13 |
| EP | 0 619 650 A2 | 3/1994 | ............. H03K/5/13 |
| JP | 09-246921 | 9/1997 | ............ H03K/3/282 |
| JP | 10-022794 | 1/1998 | ............ H03K/3/354 |
| JP | 10-270986 | 10/1998 | ............ H03K/3/282 |

OTHER PUBLICATIONS

McNeill John, "A 150mW, 155 MHz Phase Locked Loop With Low Jitter VCO", IEEE, May 30, 1994, pp. 49–52.
Ewen John F. et al, "Single Chip 1062Mbaud CMOS Transceiver For Serial Data Communication", IEEE, Feb. 1, 1995, pp. 32–33,336.
Chan Wing–Hong, "A 622–MHz Interpolating Ring VCO With Temperature Compensation And Jitter Analysis", IEEE, Jun. 9, 1997, pp. 25–28.
Yee et al., "An Integratable 1–2.5Gbps Kow Jitter CMOS Transceiver with Built in Self Test Capability" 1999 Symposium on VLSI Circuits Digest of Technical Papers, pps 45–46.

*Primary Examiner*—Arnold Kinkead
(74) *Attorney, Agent, or Firm*—Hayes Soloway PC

(57) ABSTRACT

A VCO (voltage-controlled oscillator) that can realize stable oscillation operation over a broad frequency range with a low level of jitter. The VCO includes a plurality of basic cells having differential input/output, and a center frequency adjustment circuit. The plurality of basic cells are serially connected in a ring. Each basic cell includes a circuit constituted by two delay circuits and an adder circuit, the delay times of the two delay circuits being each independently determined by the center frequency adjustment circuit. The output amplitude of each of the basic cells is controlled to a fixed value. In the adder circuit, the output of one of the delay circuits is multiplied by an addition proportion coefficient, following which the outputs of both delay circuits are added. In this way, the delay time for each basic cell can be set over a broad range.

7 Claims, 8 Drawing Sheets

VOLTAGE CONTROLLED OSCILLATOR WITH DELAY CIRCUITS

BACKGROUND OF THE INVENTION

1. Field of the Invention

The present invention relates to a voltage-controlled oscillator (VCO), and particularly to a ring VCO that is constituted by MOS (Metal-Oxide Semiconductor) transistors and that features stable operation and a broad variable frequency range.

2. Description of the Related Art

A VCO is a crucial circuit for determining the characteristics of a PLL (Phase-Locked Loop). A desirable VCO offers continuous frequency change over a broad frequency band, realizes stable oscillation, and has low noise characteristics.

A ring VCO is typically used in cases in which a VCO is to be integrated in LSI (Large-Scale Integration) such as in an ASIC (Application-Specific Integrated Circuits), because this VCO can be constructed without using inductors or capacitors, and further, the VCO allows the use of differential circuits, which are not vulnerable to noise from the power supply. A circuit described in the paper "An Integrable 1–2.5 Gbps Low-Jitter CMOS Transceiver with Built-In Self-Test Capability" (1999 Symposium on VLSI Circuits Digest of Technical Papers 5-2) is typically used as the differential circuit that is used in this type of ring VCO.

Referring now to FIG. 1, a block diagram is shown of the overall construction of one example of a ring VCO of the prior art that is made up of a plurality of gate circuits. In this figure, the internal constructions of basic cells 100-1 to 100-N are all identical, and the internal construction of basic cell 100-1 is shown in FIG. 2 as representative of these basic cells 100-1 to 100-N.

The conventional VCO shown in FIG. 1 is made up of N basic cells 100-1 to 100-N (N≧1) connected in a series. Basic cells 100-1 to 100-N are each provided with: two cell input terminals IN1 and IN2; two cell output terminals OUT1 and OUT2 from which signals that have been received via cell input terminals IN1 and IN2 are outputted in non-inverted form; and two control terminals E and F for receiving signals for controlling the currents that flow through each of basic cells 100-1 to 100-N.

Each of basic cells 100-1 to 100-N are connected in an order such that signals outputted from cell output terminals OUT1 and OUT2 of a preceding-stage basic cell are applied to cell input terminals IN1 and IN2, respectively, of the next-stage basic cell. In addition, output terminals OUT1 and OUT2 of last-stage basic cell 100-N are connected to feed back to input terminals IN2 and IN1, respectively, of first-stage basic cell 100-1 such that the logic is inverted, thereby realizing the oscillation operation.

Referring now to FIG. 2, the construction of basic cells 100-1 to 100-N is next explained with basic cell 100-1 as an example.

Basic cell 100-1 is made up of NMOS (n-channel MOS) transistors M101, M102, and M105; and PMOS (p-channel MOS) transistors M103 and M104. NMOS transistor M101 and PMOS transistor M103 form one set and NMOS transistor M102 and PMOS transistor M104 form another set, these sets constituting a differential circuit in which these set make a pair. The drains of PMOS transistors M103 and M104 are connected to power-supply voltage line V1 in common, the gates of these transistors are connected to control terminal F in common, and the sources of these transistors are connected to the drains of NMOS transistors M101 and M102, respectively. NMOS transistors M101 and M102 have their gates connected to cell input terminals IN1 and IN2, respectively, of basic cell 100-1, and their sources connected to the drain of NMOS transistor M105 in common. In addition, NMOS transistor M105 has its gate connected to control terminal E of basic cell 100-1, and its source connected to power supply voltage V2. The logic of output terminals OUT1 and OUT2 is thus inverted with each other to become the differential output.

Next, regarding the operation of the ring VCO that is constructed according to the foregoing explanation.

In basic cell 100-1, the differential signals that are applied to cell input terminals IN1 and IN2 are outputted as non-inverted signals from cell output terminals OUT1 and OUT2 with a prescribed delay time. The signals that are outputted from cell output terminals OUT1 and OUT2 of basic cell 100-1 are applied to cell input terminals IN1 and IN2 of basic cell 100-2, and similarly outputted as non-inverted signals from cell output terminals OUT1 and OUT2 of basic cell 100-2 with a prescribed delay time. Similarly, signals that are outputted from cell output terminals OUT1 and OUT2 of a preceding-stage basic cell are successively applied to cell input terminals IN1 and IN2 of the next-stage basic cell up to last-stage basic cell 100-N.

The signals that are outputted from cell output terminals OUT1 and OUT2 of last-stage basic cell 100-N are applied to cell input terminals IN2 and IN1, respectively, of first-stage basic cell 100-1 such that the logic of the signals is reversed, i.e., such that the differential logic value are inverted. The oscillation operation is thus obtained by successively applying differential signals that are inputted to basic cell 100-1 to basic cells 100-2 through 100-N, and then applying the differential signals that are outputted from basic cell 100-N to basic cell 100-1.

In this case, the oscillation frequency of the ring VCO is determined by the sum delay time of the number of connected stages of basic cells, with the delay time in each basic cell as a standard.

Furthermore, the current flowing to NMOS transistor M105 is determined by the internal resistances of PMOS transistors M103 and M104 that are regulated based on signals applied to control terminal F, and by signals applied to control terminal E. The delay in each basic cell is determined by the current that flows through this NMOS transistor M105. A desired oscillation frequency can therefore be obtained by using a PLL to control the voltage applied to control terminal E.

Nevertheless, the ring VCO according to the above description has the following problems:

(1) In order to vary the delay time in a basic cell, the internal resistance of PMOS transistors is regulated by means of the control voltage applied to the gate of the PMOS transistors or the current flowing to the basic cells is regulated by means of the control voltage applied to the gates of the NMOS transistors; but since the output amplitude also fluctuates in accordance with this current, there is a possibility danger that the oscillation will be halted depending on the combination of the operating current and the control voltage applied to the PMOS transistors.

(2) Both fluctuation in the power supply voltage and the noise that is generated from the circuit for outputting control signals for regulating the load resistance may cause the voltage across the gate and source of the PMOS transistors for adjusting load to fluctuate, and this tends to cause jitter.

(3) Regarding the characteristics of PMOS transistors, discrepancies that tend to occur in the fabrication process may give rise to variation in the internal resistance that corresponds to the control voltage that is applied to the PMOS transistors. Variation therefore occurs in the load resistance of the basic cells, and this variation complicates the accurate adjustment of delay time in the basic cells.

SUMMARY OF THE INVENTION

The present invention was realized in view of the problems of the prior art described hereinabove, and has as an object the provision of a voltage controlled oscillator (VCO) that is capable of a uniform output amplitude, that has minimal jitter, and that has a stable and broad variable frequency range.

The object of the present invention is achieved by a voltage-controlled oscillator that comprises:

a plurality of basic cells; and a center frequency adjustment circuit that outputs a control signal for setting a delay time for each of the plurality of basic cells;

each of the basic cells comprising:

first and second cell input terminals;

first and second cell output terminals from which signals that have been received from the first and second cell input terminals are outputted in non-inverted form;

a first delay circuit for delaying signals received from the first and second cell input terminals by a delay time that is set based on the control signal outputted from the center frequency adjustment circuit;

a second delay circuit for delaying output signals of the first delay circuit by a delay time that is set independently of the first delay circuit based on the control signal outputted from the center frequency adjustment circuit; and an adder circuit that adds output signals of the first delay circuit and output signals from the second delay circuit at a proportion that is based on an addition proportion coefficient that is controlled from the outside, and outputs the result of addition;

wherein, in each of the basic cells, the result of addition is applied to the first and second cell output terminals; and the basic cells are connected in a series such that the first and second cell output terminals of a preceding-stage basic cell are connected to the first and second cell input terminals, respectively, of the next-stage basic cell, and the first and second cell output terminals of the last-stage basic cell are connected to the second and first cell input terminals, respectively, of the first-stage basic cell such that the logic is reversed.

In this case, signals that are applied to the first and second cell input terminals are preferably differential logic signals.

According to the present invention, the oscillation frequency is determined by the delay time of each of the plurality of basic cells and the number of connected stages of basic cells, and the delay time in each of the basic cell is determined by the delay times of each of the first and second delay circuits that make up the basic cell and the addition proportion coefficient for determining the addition proportions of the outputs of these first and second delay circuits. Here, the delay times in each of the first and second delay circuits are preferably determined by the ratio of the values of the currents that flow in the two differential circuits within the delay circuits that are controlled by control signals outputted from the center frequency adjustment circuit, and the value of the addition proportion coefficient are preferably controlled from the outside. In this way, the delay time in each basic cell is the value obtained by adding the value of the delay time in the first delay circuit to the product of the value of the delay time in the second delay circuit and the addition proportion coefficient.

The delay time of each basic cell is shortest and the oscillation frequency is highest when the value of the addition proportion coefficient is 0 because the delay time of each basic cell depends only on the delay time in the first delay circuit. As the value of the addition proportion coefficient increases, the sum of the delay time in the first delay circuit and the delay time in the second delay circuit, which is the delay time in each basic cell, becomes larger; whereby the delay time of each basic cell becomes longer and the oscillation frequency becomes lower.

As can be understood from the foregoing explanation, the variable frequency range of the ring VCO of this invention is determined by the setting of the delay time in the second delay circuit. According to the present invention, the delay times of the basic cells can be set to change stably and continuously over a broad range.

In a case in which each delay circuit is constructed so as to include two differential circuits, adjustment is realized by control signals that are outputted from the center frequency adjustment circuit such that the sum of the values of the currents that flow in the two differential circuits in each of the first and second delay circuits is always uniform, and as a result, the output amplitude of each delay circuit is uniform despite variation of the delay time in each delay circuit, and the output of the basic cells is also stable. In addition, each of the control signals that are applied to the first and second delay circuits and the adder circuit undergoes differential amplification, thereby enabling a reduction of the influence of in-phase noise. Furthermore, the load resistance in each of the differential circuits is the internal resistance of the MOS transistor, but rather than a method of controlling the internal resistance of the MOS transistors by means of a circuit that adjusts the internal resistance, it is possible to use an element that exhibits little fluctuation in resistance due to fluctuation in the power supply voltage and noise from outside circuits. In a case in which such an element is used, noise generated within the load resistance can be greatly reduced, and the influence of fluctuation in the power supply voltage or noise can be greatly reduced compared to the prior art. Moreover, little fluctuation occurs in delay time and an output signal having a low level of jitter can be obtained.

In addition, in a case in which the control signals used for adjusting delay time and the control signals used for adjusting the addition proportion coefficient are differential voltages, the influence of noise can be greatly reduced over the prior art as described hereinabove.

The above and other objects, features, and advantages of the present invention will become apparent from the following description based on the accompanying drawings which illustrate examples of preferred embodiments of the present invention.

DESCRIPTION OF THE PREFERRED EMBODIMENTS

Figure 1:
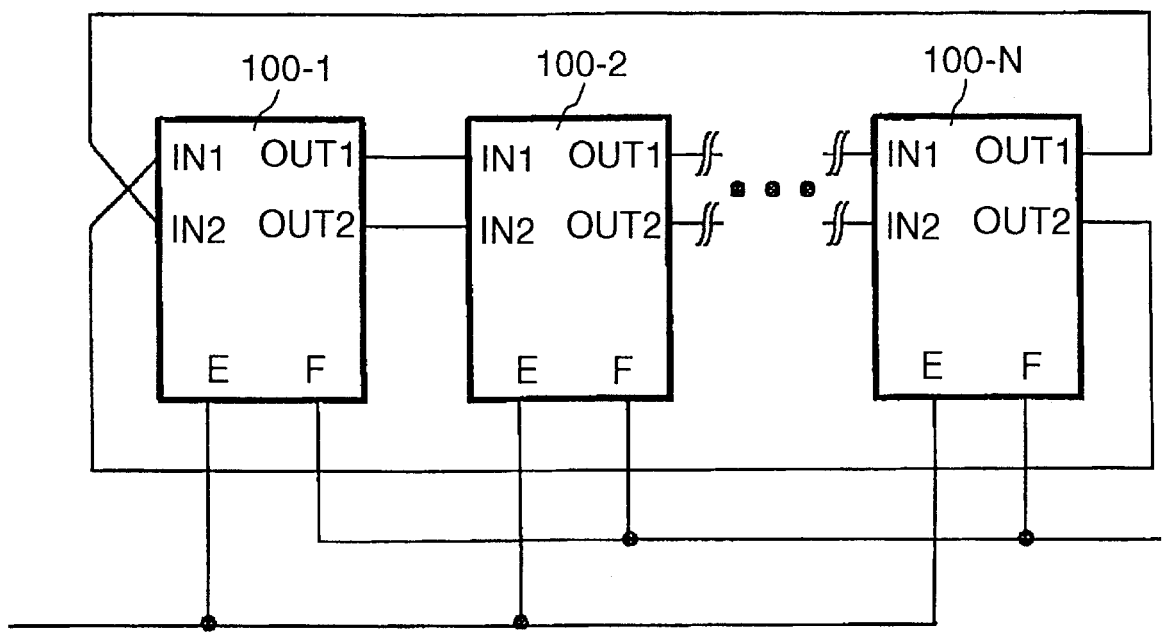
FIG. 1 is a block diagram showing an example of the overall configuration of a ring VCO of the prior art.
Figure 2:
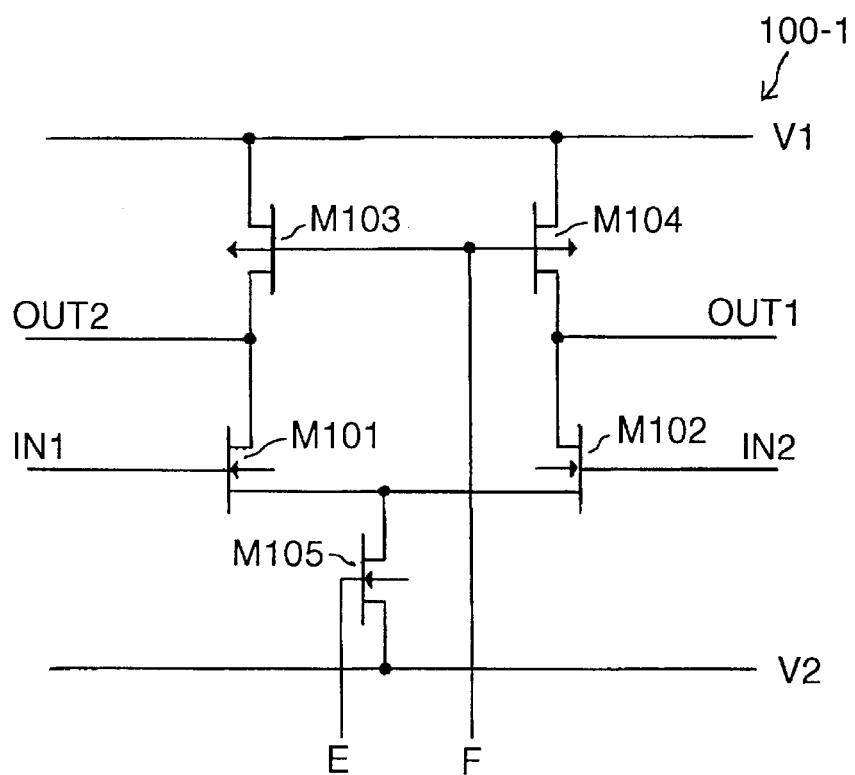
FIG. 2 is a circuit diagram showing the internal configuration of a basic cell in the circuit shown in FIG. 1.
Figure 3:
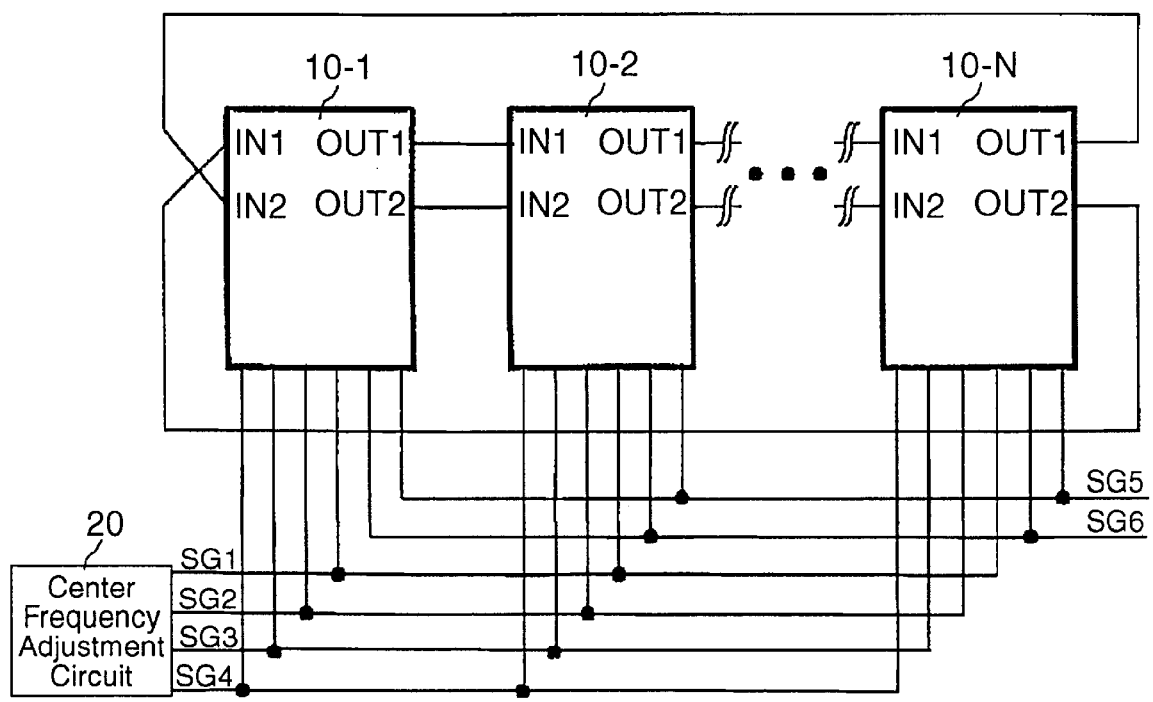
FIG. 3 is a block diagram showing the configuration of a ring VCO according to a preferable embodiment of the present invention.

Referring now to FIG. 3, a VCO according to the preferred embodiment of the present invention is made up of a plurality of basic cells 10-1 to 10-N (N≧2) that are connected in a series; and center frequency adjustment circuit 20 for outputting first to fourth control signals SG1 to SG4. First to fourth control signals SG1 to SG4 are supplied to each of basic cells 10-1 to 10-N to control the currents that flow in each of basic cells 10-1 to 10-N and thereby set each of the delay times in basic cells 10-1 to 10-N.

Each of basic cells 10-1 to 10-N includes first and second cell input terminals IN1 and IN2, and first and second cell output terminals OUT1 and OUT2 that output in non-inverted form the signals that have been received via cell input terminals IN1 and IN2. In addition, control signals SG1 to SG4 that are outputted from center frequency adjustment circuit 20 and fifth and sixth control signals SG5 and SG6 for controlling the oscillation frequency by a PLL (not shown in the figure) independent of control signals SG1 to SG4 are applied to each of basic cells 10-1 to 10-N.

From first-stage basic cell 10-1 to last-stage basic cell 10-N, cell output terminals OUT1 and OUT2 of a preceding-stage basic cell are connected to cell input terminals IN1 and IN2, respectively, of the next-stage basic cell. However, cell output terminals OUT1 and OUT2 of last-stage basic cell 10-N are connected and fed back to cell input terminals IN2 and IN1, respectively, of first-stage basic cell 10-1 such that the logic is reversed, thereby obtaining the oscillation operation.

Basic cells 10-1 to 10-N have identical construction, and the internal configuration of basic cell 10-1 is here described with reference to FIG. 4 as representative of these basic cells 10-1 to 10-N.

Basic cell 10-1 is made up by first and second delay circuits 10A and 10B, and adder circuit 10C, which adds the outputs of delay circuits 10A and 10B at a proportion that is based on control signals SG5 and SG6. First and second input terminals IN11a and IN12a of delay circuit 10A are directly connected to cell input terminals IN1 and IN2, respectively, of basic cell 10-1. First and second output terminals OUT11a and OUT12a of delay circuit 10A are connected to first and second input terminals IN11b and IN12b, respectively, of delay circuit 10B and to first and second input terminals IN13 and IN14, respectively, of adder circuit 10C. First and second output terminals OUT11b and OUT12b of delay circuit 10B are connected to third and fourth input terminals IN15 and IN16, respectively, of adder circuit 10C, and first and second output terminals OUT13 and OUT14 of adder circuit 10C are directly connected to cell output terminals OUT1 and OUT2, respectively, of basic cell 10-1.

The delay time in first delay circuit 10A changes in accordance with control signals SG1 and SG2, and the delay time in second delay circuit 10B changes in accordance with control signals SG3 and SG4. In adder circuit 10C, the addition proportion coefficient for controlling the addition proportions of the outputs from delay circuits 10A and 10B changes in accordance with control signals SG5 and SG6 from the PLL.

Figure 5:
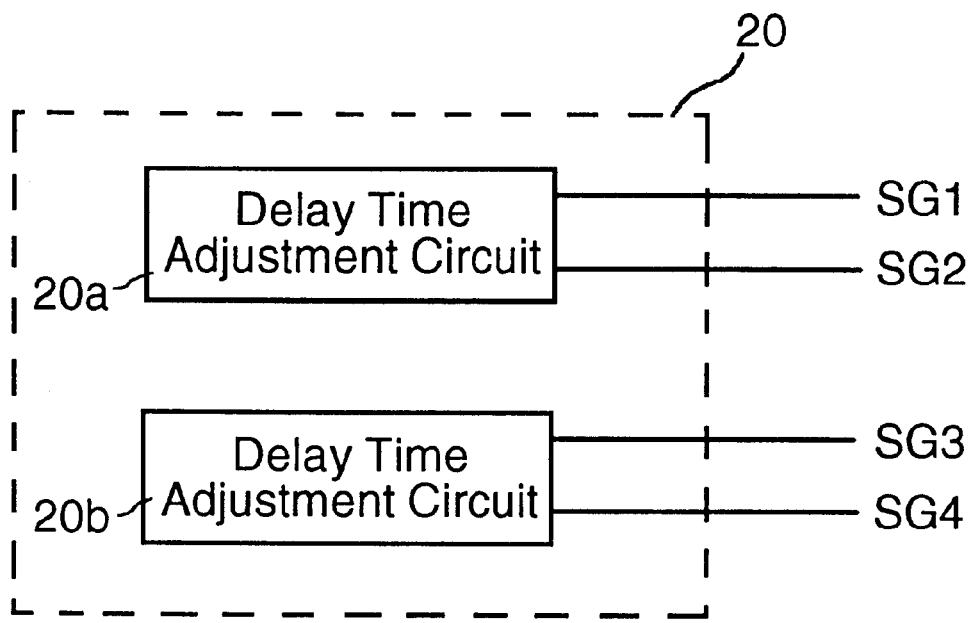
FIG. 5 is a circuit diagram showing an example of a center frequency adjustment circuit in the circuit shown in FIG. 3.

As shown in FIG. 5, center frequency adjustment circuit 20 includes delay time adjustment circuit 20a that outputs control signals SG1 and SG2 and another delay time adjustment circuit 20b that outputs control signals SG3 and SG4. Delay time adjustment circuit 20a and delay time adjustment circuit 20b have the same construction, and the circuit configuration of delay time adjustment circuit 20a is next described as representative of these two delay time adjustment circuits 20a and 20b.

Figure 6:
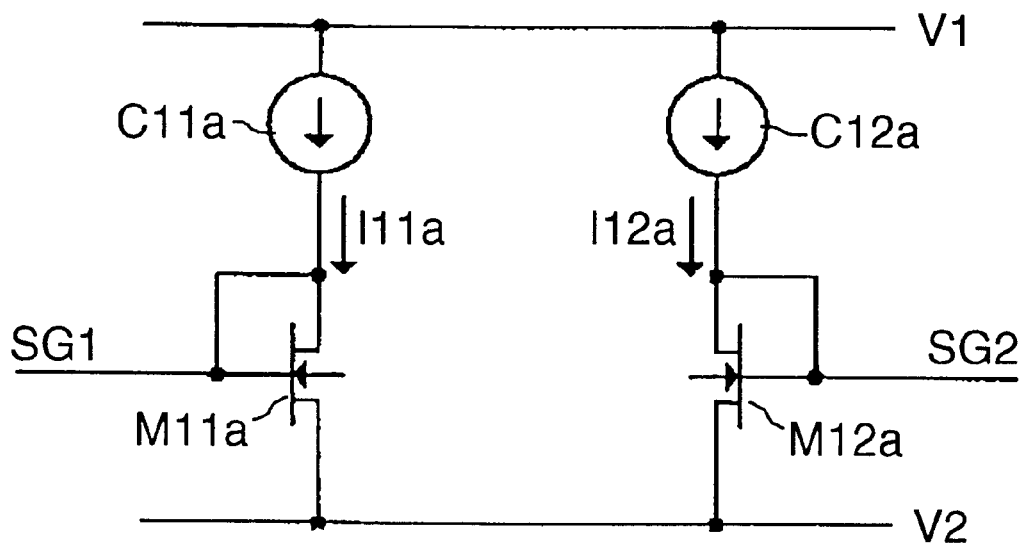
FIG. 6 is a circuit diagram showing an example of the delay time adjustment circuit in the circuit shown in FIG. 5.

Delay time adjustment circuit 20a is supplied with first power supply voltage V1 and second power supply voltage V2 having a lower potential than the first power supply voltage. As shown in FIG. 6, delay time adjustment circuit 20a is made up by: first and second NMOS transistors M11a and M12a each having their sources connected to second power supply voltage V2; and first and second constant-current power supplies C11a and C12a. The drain and gate of NMOS transistor M11a are connected to each other, and the drain and gate of NMOS transistor M12a also are connected to each other. First constant-current power supply C11a is connected between first power supply voltage V1 and the drain of NMOS transistor M11a, and second constant-current power supply C12a is connected between first power supply voltage V1 and the drain of NMOS transistor M12a. The gate voltage of NMOS transistors M11a and M12a are outputted as control signals SG1 and SG2, respectively.

Figure 7:
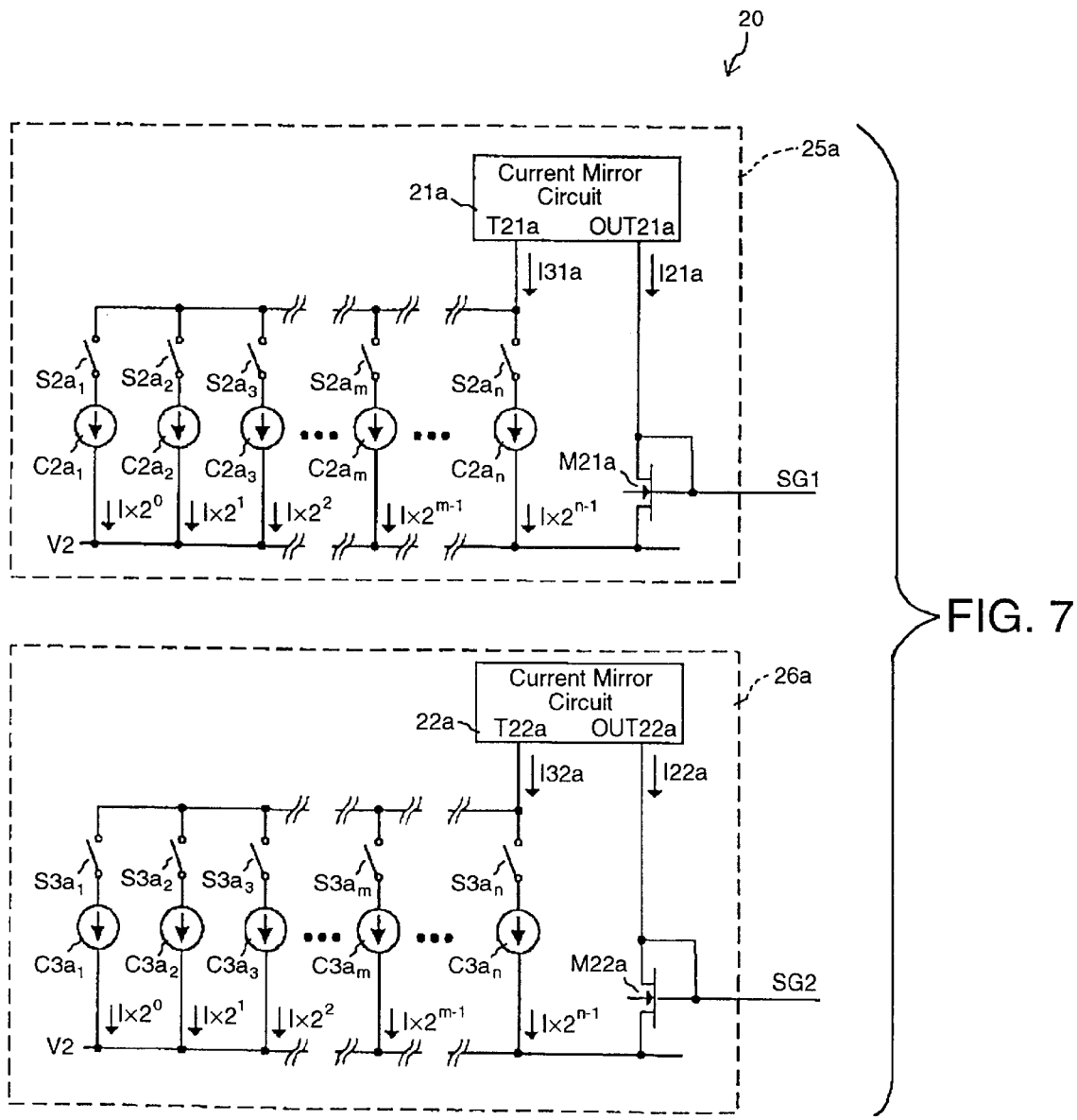
FIG. 7 is a circuit diagram showing another example of the delay time adjustment circuit in the circuit shown in FIG. 5.

The configuration of the delay time adjustment circuit is not limited to the example shown in FIG. 6, and other configurations are possible. FIG. 7 shows another example of the configuration of the delay time adjustment circuit. As with the case shown in FIG. 6, the configuration that is described here is for outputting control signals SG1 and SG2, i.e., delay time adjustment circuit 20a in FIG. 5, but this component is equivalent to the configuration for outputting control signals SG3 and SG4, i.e., delay time adjustment circuit 20b in FIG. 5.

In the example shown in FIG. 7, delay time adjustment circuit 20a is made up by control signal generation circuits 25a and 26a for outputting control signals SG1 and SG2, respectively. Control signal generation circuit 25a is made up by: current mirror circuit 21a, NMOS transistor M21a, n switches $S2a_1$ to $S2a_n$, and n constant-current power supplies $C2a_1$ to $C2a_n$. Similarly, control signal generation circuit 26a is made up by: current mirror circuit 22a, NMOS transistor M22a, n switches $S3a_1$ to $S3a_n$, and n constant-current power supplies $C3a_1$ to $C3a_n$.

Current mirror circuit 21a is provided with reference current terminal T21a for outputting a current that is set by switches $S2a_1$ to $S2a_n$ and constant-current power supplies $C2a_1$ to $C2a_n$, and current output terminal OUT21a for outputting a current of the same value as the current that is outputted from reference current terminal T21a. Similarly, current mirror circuit 22a includes reference current terminal T22a for outputting a current that is set by switches S3a$_1$ to S3a$_n$ and constant-current power supplies C3a$_1$ to C3a$_n$, and current output terminal OUT22a for outputting a current of the same value as the current that is outputted from reference current terminal T22a. Further, each of the m$^{th}$ constant-current power supplies C2a$_m$ and C3a$_m$ in control signal generation circuits 25a and 26a output a current having the value I×2$^{m-1}$ (where n≧m≧1 and I is a prescribed constant).

The m$^{th}$ constant-current power supply C2a$_m$ of control signal generation circuit 25a is connected between one end of m$^{th}$ switch S2a$_m$ and power supply voltage V2. The n sets that are composed of switches and constant-current power supplies connected in this way are connected together in parallel. The other ends of switches S2a$_1$ to S2a$_n$ are connected in common to reference current terminal T21a. The drain of NMOS transistor M21a is connected to current output terminal OUT21a, its source is connected to power supply voltage V2, and its drain and gate are connected together. The gate voltage of NMOS transistor M21a is outputted as control signal SG1. Similarly, m$^{th}$ constant-current power supply C3a$_m$ of control signal generation circuit 26a is connected between one end of m$^{th}$ switch S3a$_m$ and power supply voltage V2. The n sets of switches and constant-current power supplies that are connected in this way are connected together in parallel. The other ends of switches S3a$_1$ to S3a$_n$ are connected in common to reference current terminal T22a. The drain of NMOS transistor M22a is connected to current output terminal OUT22a, its source is connected to power supply voltage V2, and its drain and gate are connected together. Finally, the gate voltage of NMOS transistor M22a is outputted as control signal SG2.

Figure 8:
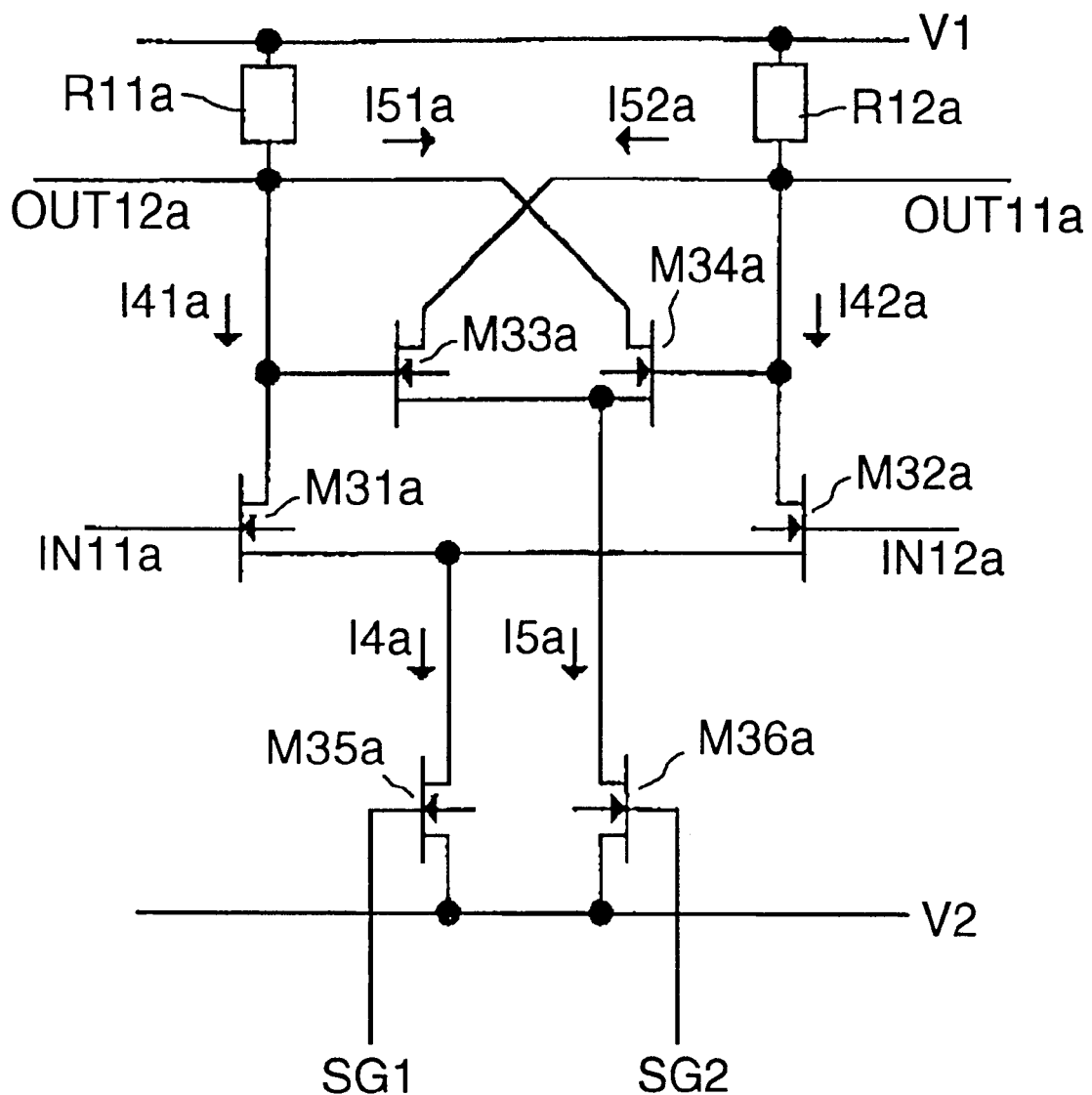
FIG. 8 is a circuit diagram showing an example of the configuration of the delay circuit that is used in the basic cell shown in FIG. 2.

Next, regarding the configuration of delay circuits 10A and 10B in the basic cells, delay circuits 10A and 10B have the same configuration, and the configuration of delay circuit 10A is next explained using FIG. 8.

Delay circuit 10A is made up by a first differential circuit composed of three NMOS transistors M31a, M32a, and M35a and a second differential circuit that is composed of another three NMOS transistors M33a, M34a, and M36a.

The gates of NMOS transistors M31a and M32a are connected to first and second input terminals IN11a and IN12a, respectively, of delay circuit 10A. The drains of NMOS transistors M31a and M34a are connected to each other and to the second output terminal OUT12a of delay circuit 10A, and then to first power supply voltage V1 by way of resistance element R11a. The drains of NMOS transistors M32a and M33a are connected to each other and to first output terminal OUT11a of delay circuit 10A, and then by way of resistance element R12a to first power supply voltage V1. The drain of NMOS transistor M31a and the gate of NMOS transistor M33a are connected to each other, and the drain of NMOS transistor M32a and the gate of NMOS transistor M34a are connected together.

Control signal SG1 is applied to the gate of NMOS transistor M35a, control signal SG2 is applied to the gate of NMOS transistor M36a, and the sources of these NMOS transistors M35a and M36a are connected in common to second power supply voltage V2, which has a lower potential than first power supply voltage V1.

The sources of NMOS transistors M31a and M32a are connected in common to the drain of NMOS transistor M35a, and the sources of NMOS transistors M33a and M34a are connected to the drain of NMOS transistor M36a.

Although not shown in the figures, delay circuit 10B is provided with two NMOS transistors that are equivalent to the above-described NMOS transistors M35a and M36a, respectively, and control signals SG3 and SG4 are applied to respective gates of these transistors.

Figure 9:
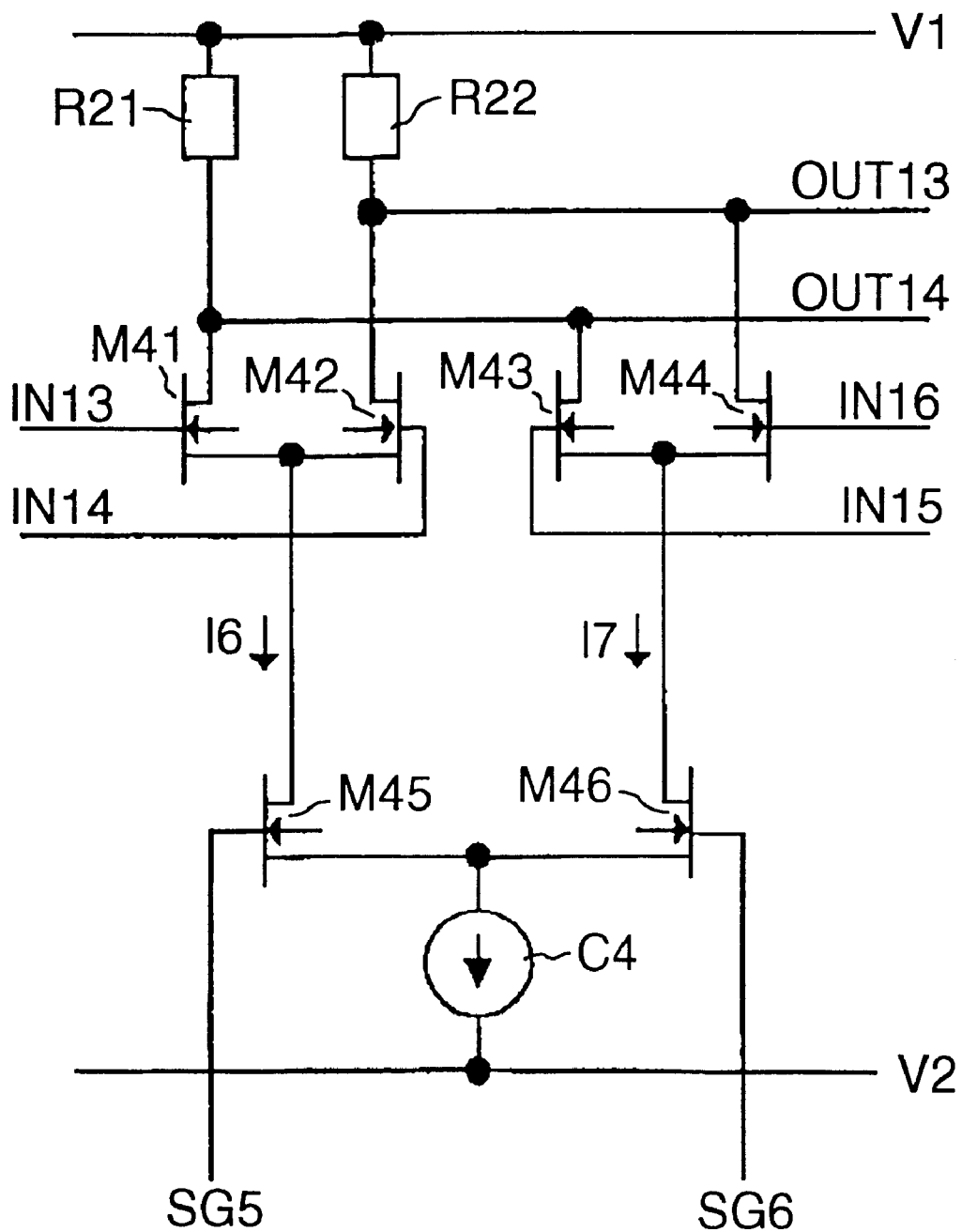
FIG. 9 is a circuit diagram showing an example of the configuration of the adder circuit that is used in the basic cell shown in FIG. 2.

The configuration of adder circuit 10C that is provided in the basic cells is next described using FIG. 9. Adder circuit 10C is made up from a first differential circuit composed of three NMOS transistors M41, M42, and M45, and a second differential circuit composed of another three NMOS transistors M43, M44, and M46.

The gates of NMOS transistors M41 to M44 are connected to first to fourth input terminals IN13 to IN16, respectively, of adder circuit 10C. The drains of NMOS transistors M42 and M44 are connected to each other and to first output terminal OUT13 of adder circuit 10C, and in addition, to first power supply voltage V1 by way of resistance element R22. Similarly, the drains of NMOS transistors M41 and M43 are connected to each other and to second output terminal OUT14 of adder circuit 10C, and in addition, to first power supply voltage V1 by way of resistance element R21. The sources of NMOS transistors M41 and M42 are connected together with the drain of NMOS transistor M45, and the sources of NMOS transistors M43 and M44 are connected to the drain of NMOS transistor M46.

Control signal SG5 is applied to the gate of NMOS transistor M45, and control signal SG6 is applied to the gate of NMOS transistor M46. Constant-current power supply C4 is connected between the sources of NMOS transistors M45 and M46 and second power supply voltage V2.

Next, regarding the operation of the ring VCO that is constructed as described in the foregoing explanation.

In FIG. 3, differential signals that are applied to cell input terminals IN1 and IN2 of basic cell 10-1 are outputted from cell output terminals OUT1 and OUT2 of basic cell 10-1 in non-inverted form and with a prescribed delay time. These differential signals that are outputted from cell output terminals OUT1 and OUT2 of basic cell 10-1 are applied to cell input terminals IN1 and IN2 of basic cell 10-2, and similarly, outputted from cell output terminals OUT1 and OUT2 of basic cell 10-2 in non-inverted form and with a prescribed delay time. Continuing in the same manner, the differential signals that are outputted from cell output terminals OUT1 and OUT2 of a preceding-stage basic cell are successively applied to cell input terminals IN1 and IN2 of the next-stage basic cell until last-stage basic cell 10-N.

The differential signals that are outputted from cell output terminals OUT1 and OUT2 of last-stage basic cell 10-N are applied to cell input terminals IN2 and IN1, respectively, of first-stage basic cell 10-1 such that the logic of the signals is reversed. In this way, the differential signals that are applied to basic cell 10-1 are successively applied to basic cells 10-2 to 10-N, following which the differential signals that are outputted from basic cell 10-N are applied to basic cell 10–1, thereby realizing the oscillation operation.

Here, the oscillation frequency of the ring VCO is determined by the number of connected stages of basic cells, with the delay time in each stage of basic cells as a standard. The manner in which the delay time for each basic cell is determined is explained hereinbelow taking basic cell 10-1 as an example.

Figure 4:
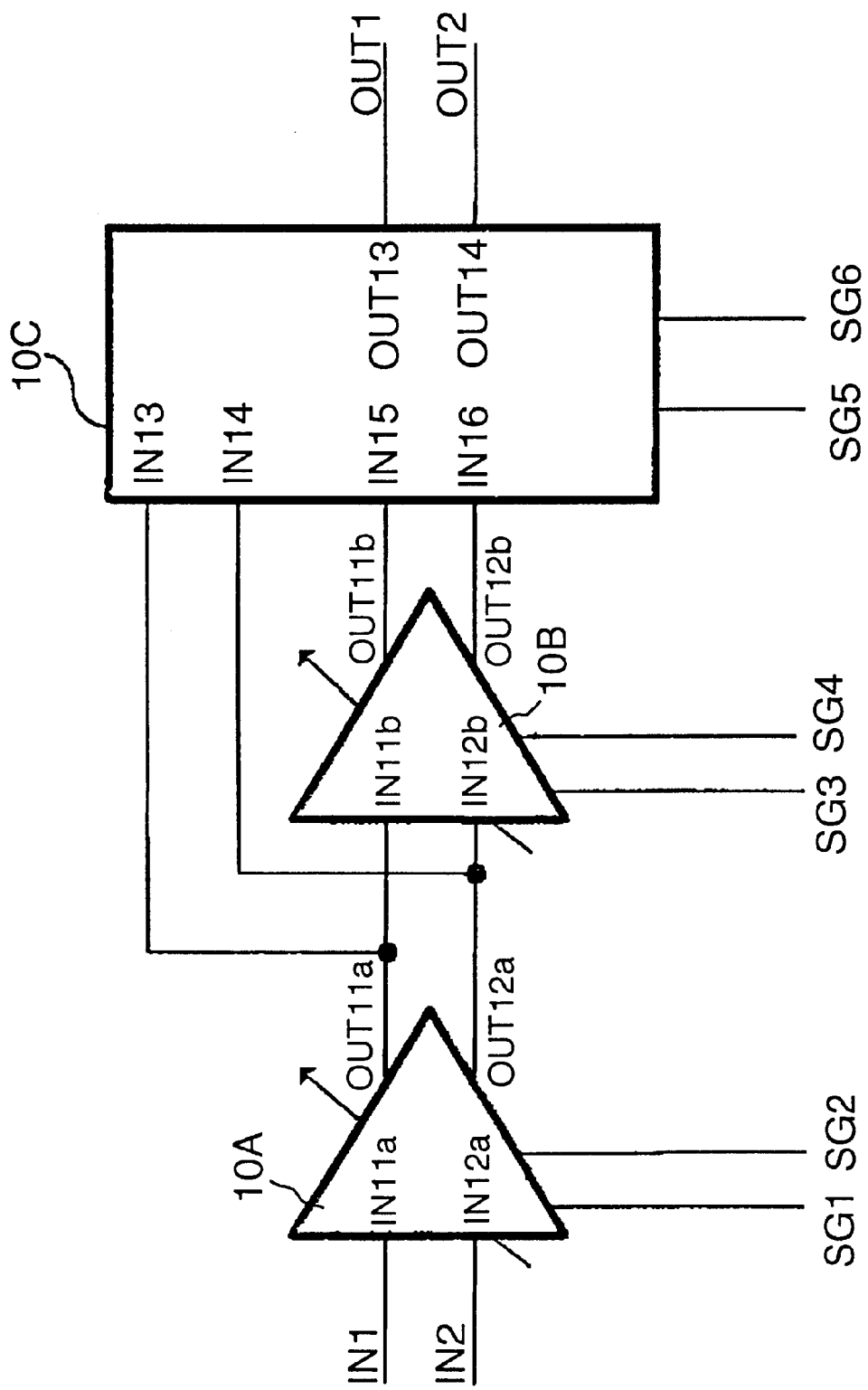
FIG. 4 is a circuit diagram showing an example of the internal configuration of a basic cell in the circuit shown in FIG. 3.

In FIG. 4, d1 is the delay time in delay circuit 10A and d2 is the delay time in delay circuit 10B. Delay time d1 in delay circuit 10A is determined by control signals SG1 and SG2, and delay time d2 in delay circuit 10B is determined by control signals SG3 and SG4. In adder circuit 10C, moreover, addition proportion coefficient k (where $0 \leq k \leq 1$) for controlling the addition proportions of the outputs from delay circuits 10A and 10B is determined by control signals SG5 and SG6.

Regarding the delay time in basic cell 10-1, delay time d2 of delay circuit 10B is first multiplied by addition proportion coefficient k, following which the product of multiplying delay time d2 by addition proportion coefficient k is added to the value of delay time d1. The delay time from cell input terminals IN1 and IN2 to cell output terminals OUT1 and OUT2 of basic cell 10-1 is therefore represented by (d1+k·d2).

The oscillation frequency Fr of a ring VCO in which N stages of basic cells are connected is represented by:

In the ring VCO according to this embodiment, the voltages of control signals SG1 to SG4 are first determined by center frequency adjustment circuit 20 to fix delay times d1 and d2 in delay circuits 10A and 10B, following which synchronization to a desired frequency is realized by control signals SG5 and SG6 that are outputted from PLL.

If oscillation center frequency Fc is the frequency that is substantially at the center of a desired oscillation frequency band, oscillation center frequency Fc of a ring VCO in which N stages of basic cells are connected is represented by:

When it is wished to change the oscillation center frequency Fc, the voltages of control signals SG1 to SG4 are altered to change delay times d1 and d2. Since delay times d1 and d2 can be adjusted over a broad range by control signals SG1 to SG4, this voltage-controlled oscillator enables setting of oscillation center frequency Fc over a wide frequency range. In a case in which addition proportion coefficient k is set to k=0 by control signals SG5 and SG6 that are outputted from PLL, the oscillation frequency is determined only by delay time d1 in delay circuit 10A. Alternatively, in a case in which k is set to k=1, the oscillation frequency is determined by the sum (d1+d2) of the delay time in delay circuit 10A and the delay time in delay circuit 10B.

The delay time in basic cell 10-1 therefore changes continuously from d1 to (d1+d2) by means of addition proportion coefficient k. As a result, in this VCO, a variable frequency range can be obtained that depends on the length of time of delay time d2 in delay circuit 10B.

As can be understood from the foregoing explanation, this embodiment enables the realization of a ring VCO having a wide variable frequency band that is capable of oscillation over a wide frequency range.

Next, the output operation of control signals SG1 to SG4 in center frequency adjustment circuit 20 is explained in greater detail.

In delay time adjustment circuit 20a shown in FIG. 6, I11a is the current outputted from constant-current power supply C11a, and I12a is the current outputted from constant-current power supply C12a. Further, setting is established such that the sum of current I11a and current I12a is always fixed. Currents I11a and I12a are converted to the voltages of control signals SG1 and SG2 in NMOS transistors M11a and M12a, and applied to delay circuits 10A that are provided in basic cells 10-1 to 10-N. Similarly, control signals SG3 and SG4 are generated in delay time adjustment circuit 20b, and these control signals SG3 and SG4 are applied to delay circuits 10B that are provided in basic cells 10-1 to 10-N.

In the case of delay time adjustment circuit 20a that is shown in FIG. 7, the currents that are outputted from reference current terminals T21a and T22a of current mirror circuits 21a and 22a are I31a and I32a, respectively; and the currents that are outputted from current output terminals OUT21a and OUT22a of current mirror circuits 21a and 22a are I21a and I22a, respectively. In addition, the $m^{th}$ switch S2$a_m$ among switches S2$a_1$ to S2$a_n$ of control signal generation circuit 25a and the $m^{th}$ switch S3$a_m$ among switches S3$a_1$ to S3$a_n$ of control signal generation circuit 26a make up a set, one being set to open and close at the logic that is the reverse of the logic at which the other opens and closes. In other words, when switch S2$a_m$ is ON, switch S3$a_m$ is OFF; and when switch S2$a_m$ is OFF, switch S3$a_m$ is ON. The sets of first to $n^{th}$ switches are each set arbitrarily and independently of each other. As a result, in the case of the delay time adjustment circuit shown in FIG. 7, current I31a that is outputted from reference current terminal T21a of current mirror circuit 21a can be set arbitrarily to a binary number by constant-current power supplies C2$a_1$ to C2$a_n$ and switches S2$a_1$ to S2$a_n$; and current I32a that is outputted from reference current terminal T22a of current mirror circuit 22a also can be set arbitrarily to a binary number by constant-current power supplies C3$a_1$ to C3$a_n$ and switches S3$a_1$ to S3$a_n$.

At this time, current I21a of the same value as current I31a is outputted from current output terminal OUT21a of current mirror circuit 21a; and current I22a of the same value as current I32a is outputted from current output terminal OUT22a of current mirror circuit 22a. Settings are thus possible such that the sum of current I21a and current I22a is always uniform.

Current I21a outputted from current output terminal OUT21a of current mirror circuit 21a is converted to the voltage of control signal SG1 in NMOS transistor M21a, and current I22a outputted from current output terminal OUT22a of current mirror circuit 22a is converted to the voltage of control signal SG2 in NMOS transistor M22a. These control signals SG1 and SG2 are applied to each of delay circuits 10A provided within basic cells 10-1 to 10-N. Control signals SG3 and SG4 are similarly generated in delay time adjustment circuit 20b, and these control signals SG3 and SG4 are applied to each of delay circuits 10B provided within basic cells 10-1 to 10-N.

In a case in which the delay time adjustment circuit shown in FIG. 7 is used, oscillation center frequency Fc of the ring VCO can be set to a binary number, as compared to a case in which the device shown in FIG. 6 is used, thereby facilitating adjustment when using digital circuits.

The delay operation of delay circuits 10A and 10B is next explained taking delay circuit 10A as an example.

Referring to FIG. 8, I4a and I5a are the currents that flow through NMOS transistors M35a and M36a, respectively; I41a and I42a are the currents that flow through NMOS transistors M31a and M32a, respectively; and I52a and I51a are the currents that flow through NMOS transistors M33a and M34a, respectively.

Figure 10A:
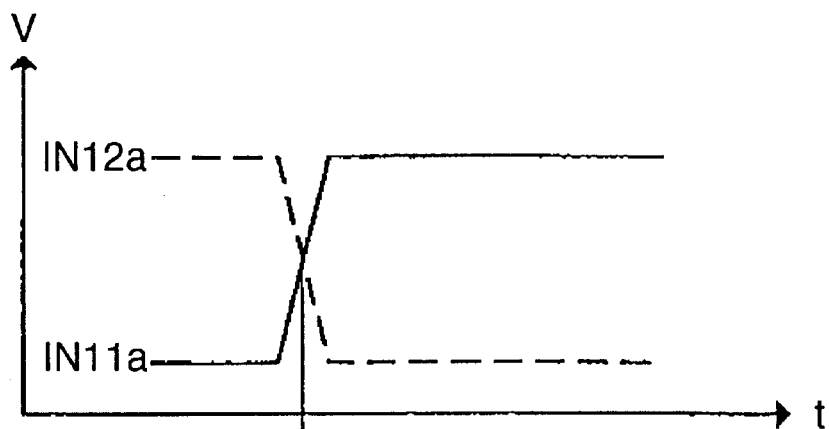
FIGS. 10A to 10C are views for explaining change over time in the output voltage of the delay circuit shown in FIG. 8.
Figure 10B:
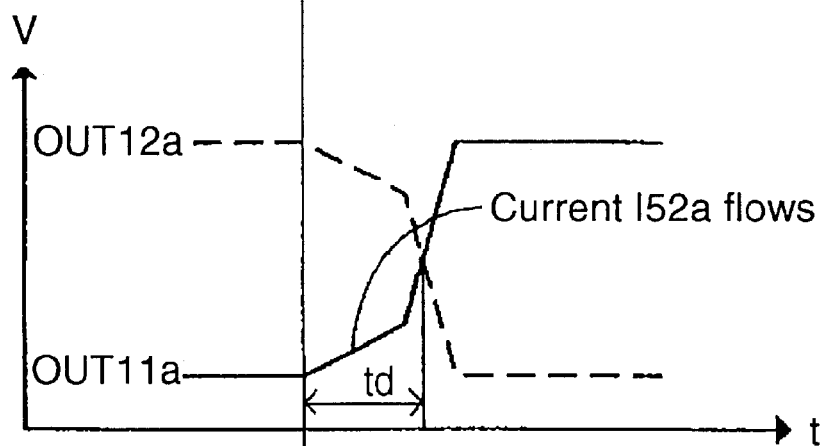
Figure 10C:
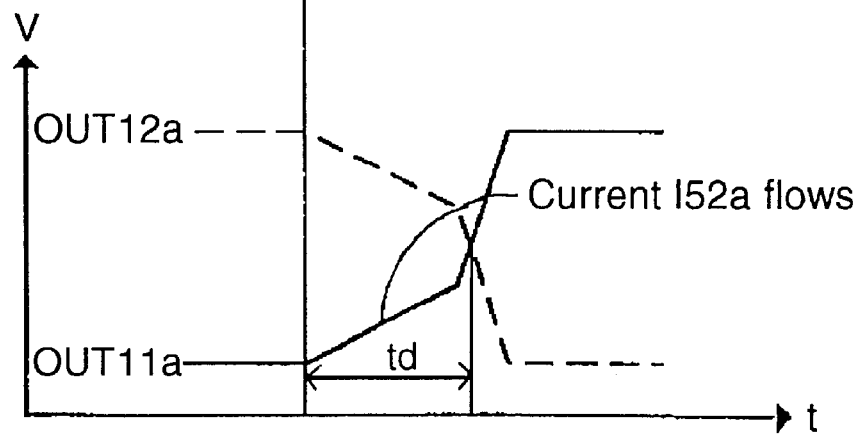

FIGS. 10A to 10C are views for explaining the change over time in the output voltage of delay circuit 10A shown in FIG. 8. FIG. 10A shows the change in voltage at input terminals IN11a and IN12a. FIG. 10B shows the change in voltage at output terminals OUT11a and OUT12a that accompanies the change in voltage at input terminals IN11a and IN12a shown in FIG. 10A when the value of current I5a is low, i.e., when the delay time is short. FIG. 10C shows the change in voltage at output terminals OUT11a and OUT12a that accompanies change in the voltage at input terminals IN11a and IN12a shown in FIG. 10A when the value of current I5a is high, i.e., when the delay time is long.

A case is here considered in which the voltage of input terminal IN11a becomes sufficiently higher than the voltage of input terminal IN12a, i.e., a case in which the logic of input terminal IN11a changes from "0" to "1," as shown in FIG. 10A.

The voltage of output terminal OUT12a first falls simultaneously with the flow of current I41a. However, current I52a continues to flow during the interval of time td due to the charge that is stored in NMOS transistor M33a. As a result, time interval td is needed from the time that the logic of input terminal IN11a changes from "0" to "1" until the time that the logic of output terminal OUT11a becomes "1." This time interval td is the delay time in the second differential circuit.

Since the sum of current I51a and current I52a is always the value of current I5a, delay time td in the second differential circuit depends on the size of current I5a, and the delay time therefore becomes short when the value of current I5a is low as shown in FIG. 10B, and becomes long when the value of current I5a is high as shown in FIG. 10C. In other words, delay time td in the second differential circuit is determined by the voltage of control signal SG2, and similarly, the delay time in the first differential circuit is determined by the voltage of control signal SG1.

The operation of adder circuit 10C is next described. In FIG. 9, current I6 is the current that flows through NMOS transistor M45, and current I7 is the current that flows through NMOS transistor M46.

Currents I6 and I7 are controlled by the voltages of control signals SG5 and SG6, the sum of current I6 and current I7 is always uniform due to constant-current power supply C4, and addition proportion coefficient k is a value such that $0 \leq k \leq 1$. Addition proportion coefficient k changes according to the ratio between current I6 and I7.

The differential signals having a delay time d1 and that are outputted from delay circuit 10A make up a first differential signal pair and the differential signals having a delay time d2 that are outputted from delay circuit 10B make up a second differential signal pair. The two signals of first differential signal pair which are applied to NMOS transistors M41 and M42 are a first signal and second signal, respectively. The two signals of second differential signal pair which are applied to NMOS transistors M43 and M44 are a third signal and fourth signal, respectively.

The first signal and the third signal multiplied by addition proportion coefficient k are vector-added in resistance element R21. Similarly, the second signal and the fourth signal multiplied by addition proportion coefficient k are vector-added in resistance element R22. As a result, fifth and sixth signals having a delay time (d1+k·d2) are outputted from output terminals OUT1 and OUT2.

Although six NMOS transistors M31a to M36a were used in each of delay circuits 10A and 10B in this embodiment, six PMOS transistors may be used in place of these NMOS transistors M31a to M36a. It goes without saying that in a case of using PMOS transistors in place of NMOS transistors, the potentials of the first power supply voltage and the second power supply voltage should be exchanged.

In addition, although two resistors R11a and R12a are used in each of delay circuits 10A and 10B, in place of these resistors R11a and R12a, it is also possible to use: a first PMOS transistor having its drain connected to first power supply voltage V1, its gate to which a third power supply voltage that is determined by the first and second power supply voltages is applied, and its source connected to second output terminal OUT12a; and a second PMOS transistor having its drain connected to first power supply voltage V1, its gate connected to the third power supply voltage, and its source connected to first output terminal OUT11a. The third power supply voltage is a potential necessary for causing the PMOS transistors to operate normally.

As described hereinabove, the ring VCO according to this embodiment both stabilizes the value of output amplitude at a uniform value over a broad frequency range and is constituted by a plurality of differential circuits, whereby the influence of fluctuation in the power supply voltage and noise from outside circuits can be suppressed. As a result, a ring VCO can be realized that has a stable oscillation output and low jitter. Specifically, a ring VCO can be realized that has continuous and linear frequency change that is free of halts in oscillation over a broad frequency band, that can obtain approximately five times the variable frequency width of a ring VCO of the prior art, and moreover, that has a low level of jitter.

While preferred embodiments of the present invention have been described using specific terms, such description is for illustrative purposes only, and it is to be understood that changes and variations may be made without departing from the spirit or scope of the following claims.

What is claimed is:

1. A voltage-controlled oscillator comprising:

a plurality of basic cells; and a center frequency adjustment circuit that outputs a control signal for setting a delay time for each of said plurality of basic cells;

each of said basic cells comprising:
first and second cell input terminals;
first and second cell output terminals from which signals that have been received from said first and second cell input terminals are outputted in non-inverted form;
a first delay circuit for delaying signals received from said first and second cell input terminals by a delay time that is set based on the control signal outputted from said center frequency adjustment circuit;
a second delay circuit for delaying output signals of said first delay circuit by a delay time that is set independently of said first delay circuit based on the control signal outputted from said center frequency adjustment circuit; and
an adder circuit that adds said output signals of said first delay circuit and output signals from said second delay circuit at a proportion that is based on an additional proportion coefficient that is controlled from outside and outputs a result of addition;
wherein, in each of said basic cells, said result of addition is applied to said first and second cell output terminals; and
the basic cells are connected in a series such that said first and second cell output terminals of a preceding-stage basic cell are connected to said first and second cell input terminals, respectively, of the next-stage basic cell, and said first and second cell output terminals of the last-stage basic cell are connected to the second and first cell input terminals, respectively, of the first-stage basic cell such that logic is reversed;

wherein said center frequency adjustment circuit comprises a plurality of delay time adjustment circuits each having first and second control signal generation circuits;

each of said control signal generation circuits comprises:

a plurality of switches that are connected to each other in parallel;

a plurality of constant-current power supplies that are each serially connected to one of said plurality of switches and that output different currents;

a current mirror circuit that is connected to sides of said plurality of switches that are not connected to said constant-current power supplies, said current mirror circuit comprising: a reference current terminal for outputting a current that is set by said plurality of switches and said plurality of constant-current power supplies, and a current output terminal for outputting a current of a same value as the current that is outputted from the reference current terminal; and a MOS (Metal-Oxide-Semiconductor) transistor having a drain connected to the current output terminal of said current mirror circuit, a source connected to a power-supply voltage, and a gate connected to each of said plurality of basic cells, said drain and gate of said MOS transistor being connected together.

2. A voltage-controlled oscillator according to claim 1, wherein said different currents are represented by values in which a prescribed value are multiplied by values expressed by a factorial of 2.

3. A voltage-controlled oscillator according to claim 1, wherein said MOS transistor is an NMOS (N-channel MOS) transistor.

4. A voltage-controlled oscillator comprising:

a plurality of basic cells; and a center frequency adjustment circuit that outputs a control signal for setting a delay time for each of said plurality of basic cells;

each of said basic cells comprising:

first and second cell input terminals;

first and second cell output terminals from which signals that have been received from said first and second cell input terminals are outputted in non-inverted form;

a first delay circuit for delaying signals received from said first and second cell input terminals by a delay time that is set based on the control signal outputted from said center frequency adjustment circuit;

a second delay circuit for delaying output signals of said first delay circuit by a delay time that is set independently of said first delay circuit based on the control signal outputted from said center frequency adjustment circuit; and an adder circuit that adds said output signals of said first delay circuit and output signals from said second delay circuit at a proportion that is based on an additional proportion coefficient that is controlled from outside and outputs a result of addition;

wherein, in each of said basic cells, said result of addition is applied to said first and second cell output terminals; and the basic cells are connected in a series such that said first and second cell output terminals of a preceding-stage basic cell are connected to said first and second cell input terminals, respectively, of the next-stage basic cell, and said first and second cell output terminals of the last-stage basic cell are connected to the second and first cell input terminals, respectively, of the first-stage basic cell such that logic is reversed;

wherein each of said delay circuits comprises:

first and second input terminals;

first and second output terminals from which signals that have been applied to said first and second input terminals are each outputted in non-inverted form with a prescribed delay time that is based on the control signal outputted from said center frequency adjustment circuit;

a first MOS (Metel-Oxide-Semiconductor) transistor having a gate connected to said first input terminal, and a drain connected to both a first power-supply voltage by way of a first resistor and to said second output terminal;

a second MOS transistor having a gate connected to said second input terminal, and a drain connected to both the first power-supply voltage by way of a second resistor and to said first output terminal;

a third MOS transistor having a gate connected to said drain of said first MOS transistor, and a drain connected to said drain of said second MOS transistor;

a fourth MOS transistor having a gate connected to said drain of said second MOS transistor, and a drain connected to said drain of said first MOS transistor;

a fifth MOS transistor having a source connected to a second power-supply voltage having a different potential from said first power-supply voltage, a drain connected in common to said sources of said first and second MOS transistors, and a gate connected to said center frequency adjustment circuit; and a sixth MOS transistor having a source connected to said second power-supply voltage, a drain connected in common to said sources of said third and fourth MOS transistors, and a gate connected to said center frequency adjustment circuit.

5. A voltage-controlled oscillator according to claim 4, wherein said first to sixth MOS transistors are all MOS transistors of same conductivity type.

6. A voltage-controlled oscillator according to claim 4, wherein said first to sixth MOS transistors are all NMOS (N-channel MOS) transistors and said second power-supply voltage has a lower potential than said first power-supply voltage.

7. A voltage-controlled oscillator comprising;

a plurality of basic cells; and a center frequency adjustment circuit that outputs a control signal for setting a delay time for each of said plurality of basic cells;

each of said basic cells comprising:

first and second cell input terminals;

first and second cell output terminals from which signals that have been received from said first and second cell input terminals are outputted in non-inverted form;

a first delay circuit for delaying signals received from said first and second cell input terminals by a delay time that is set based on the control signal outputted from said center frequency adjustment circuit;

a second delay circuit for delaying output signals of said first delay circuit by a delay time that is set independently of said first delay circuit based on the control signal outputted from said center frequency adjustment circuit; and an adder circuit that adds said output signals of said first delay circuit and output signals from said second delay circuit at a proportion that is based on an additional proportion coefficient that is controlled from outside and outputs a result of addition;

wherein, in each of said basic cells, said result of addition is applied to said first and second cell output terminals; and the basic cells are connected in a series such that said first and second cell output terminals of a preceding-stage basic cell are connected to said first and second cell input terminals, respectively, of the next-stage basic cell, and said first and second cell output terminals of the last-stage basic cell are connected to the second and first cell input terminals, respectively, of the first-stage basic cell such that logic is reversed;

wherein each of said delay circuit comprises:

first and second input terminals;

first and second output terminals from which signals that have been received at said first and second input terminals are each outputted in non-inverted form with a prescribed delay time based on the control signals outputted from said center frequency adjustment circuit;

first and second PMOS (P-channel Metal-Oxide-Semiconductor) transistors having drains each connected to a first power-supply voltage, and gates connected in common to an auxiliary power-supply voltage;

a first NMOS (N-channel Metel-Oxide-Semiconductor) transistor having a gate connected to said first input terminal, and a drain connected to both said source of said first PMOS transistor and to said second output terminal;

a second NMOS transistor having a gate connected to said second input terminal, and a drain connected to both said source of said second PMOS transistor and to said first output terminal;

a third NMOS transistor having a gate connected to said drain of said first NMOS transistor, and a drain connected to said drain of said second NMOS transistor;

a fourth NMOS transistor having a gate connected to said drain of said second NMOS transistor, and a drain connected to said drain of said first NMOS transistor;

a fifth NMOS transistor having a source connected to a second power-supply voltage, a drain connected in common to said sources of said first and second NMOS transistors, and a NMOS transistors, and a gate connected to said center frequency adjustment circuit; and a sixth NMOS transistor having a source connected to said second power-supply voltage, a drain connected in common to said sources of said third and fourth NMOS transistors, and a gate connected to said center frequency adjustment circuit.

* * * * *

UNITED STATES PATENT AND TRADEMARK OFFICE
CERTIFICATE OF CORRECTION

PATENT NO. : 6,472,944 B2
DATED : October 29, 2002
INVENTOR(S) : Soda

It is certified that error appears in the above-identified patent and that said Letters Patent is hereby corrected as shown below:

Column 14,
Line 8, "Metel" should read -- Metal --.

Column 15,
Line 9, "circuit" should read -- circuits --.
Line 22, "Metel" should read -- Metal --.

Column 16,
Line 14, delete "NMOS transistors, and a"

Signed and Sealed this

Sixth Day of July, 2004

JON W. DUDAS
*Acting Director of the United States Patent and Trademark Office*